(12) United States Patent  (10) Patent No.: US 8,268,662 B2
Kao  (45) Date of Patent: Sep. 18, 2012

(54) FABRICATING METHOD OF COMPLEMENTARY METAL-OXIDE-SEMICONDUCTOR (CMOS) IMAGE SENSOR

(75) Inventor: Ching-Hung Kao, Hsinchu Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/026,302

(22) Filed: Feb. 14, 2011

(65) Prior Publication Data

US 2011/0136292 A1 Jun. 9, 2011

Related U.S. Application Data

(62) Division of application No. 12/038,360, filed on Feb. 27, 2008, now Pat. No. 7,939,867.

(51) Int. Cl.
*H01L 31/0216* (2006.01)
(52) U.S. Cl. ............. 438/75; 438/73; 438/57; 438/217; 438/218; 257/59; 257/E31.119
(58) Field of Classification Search ............. 438/75, 438/73, 57, 217, 218; 257/E31.119, 59
See application file for complete search history.

(56) References Cited

U.S. PATENT DOCUMENTS

| 6,514,810 | B1 | 2/2003 | Kim |
| 6,730,555 | B2 | 5/2004 | Kim |
| 6,818,930 | B2 | 11/2004 | Mouli |
| 6,885,047 | B2 | 4/2005 | Shinohara |
| 2004/0000681 | A1 | 1/2004 | Shinohara |
| 2005/0279998 | A1* | 12/2005 | Cole et al. ............ 257/59 |
| 2006/0148195 | A1 | 7/2006 | Hwang |

FOREIGN PATENT DOCUMENTS

CN 1819138 A 8/2006

* cited by examiner

*Primary Examiner* — Thinh T Nguyen
(74) *Attorney, Agent, or Firm* — Winston Hsu; Scott Margo

(57) ABSTRACT

A method of fabricating a complementary metal-oxide-semiconductor (CMOS) image sensor is provided. First, an isolation structure is formed in a substrate with a photo-sensitive region and a transistor device region in the substrate. The transistor device region includes at least a region for forming a transfer transistor. A dielectric layer and a conductive layer are sequentially formed on the substrate. An ion implantation process is performed to implant a dopant into the substrate below the position for forming a gate of the transfer transistor and in the photo-sensitive region through the conductive layer and the dielectric layer. The conductive layer and the dielectric layer are patterned to at least form the gate structure of the transfer transistor on the transistor device region. Thereafter, a photo diode is formed in the substrate in the photo-sensitive region.

19 Claims, 13 Drawing Sheets

FABRICATING METHOD OF COMPLEMENTARY METAL-OXIDE-SEMICONDUCTOR (CMOS) IMAGE SENSOR

CROSS REFERENCE TO RELATED APPLICATIONS

This application is a divisional application of and claims the benefit of U.S. patent application Ser. No. 12/038,360, filed Feb. 27, 2008.

BACKGROUND OF THE INVENTION

1. Field of the Invention

The present invention relates to an image sensor and a fabricating method thereof. More particularly, the present invention relates to a complementary metal-oxide-semiconductor image sensor (CIS) and a fabricating method thereof.

2. Description of the Prior Art

The fabrication process of a complementary metal-oxide-semiconductor image sensor (CIS) is compatible with that of a CMOS, so it is easy to be integrated with other peripheral circuits on the same chip, thereby greatly reducing the cost and power consumption of the image sensor. In recent years, in the field of low price applications, CIS becomes a substitute for charge-coupled devices, and thus the importance of CIS is increased rapidly.

A CIS is constituted by a photo diode (PD) and a plurality of transistors. The PD is constituted by a p-n junction formed by an n-doped region and a p-type substrate, and the transistor is an n-type transistor with an n-type gate (n-poly NMOS). At present, the structure of a CIS may be classified into two categories, namely the 3-T architecture and the 4-T architecture. The 3-T architecture refers to the structure of the CIS includes a reset transistor (Rx), a source follower transistor (Dx), a selection transistor (Sx), and a photo diode (PD). The 4-T architecture refers to the structure of the CIS includes a transfer transistor (Tx), a reset transistor, a source follower transistor, a selection transistor, and a PD.

Currently, it is a common problem that a dark current may be generated in the CIS. Generally speaking, during the fabrication process of the CIS, before a gate oxide layer is formed, an implantation process is performed to implant a dopant into the substrate at the position for forming a gate of a transfer transistor. Or, another implantation process is performed to implant a dopant into the substrate on periphery of an isolation structure adjoining to a photo-sensitive region, thereby forming a protection layer in the implantation region to alleviate the dark current.

However, when a thick gate oxide layer or a composite structure of conductive layer/dielectric layer/conductive layer needs to be formed in the fabrication process of the CIS, a severe diffusion of the protection layer may occur due to a thermal process, so the effect on eliminating the dark current is limited, and also the pixel performance of the image sensor may be adversely affected. Moreover, in addition to the above problem, the ion implantation process performed before forming the gate oxide layer may damage the surface of the substrate during the ion implantation process.

SUMMARY OF THE INVENTION

The present invention is directed to a complementary metal-oxide-semiconductor image sensor (CIS) and a fabricating method thereof, so as to further alleviate the dark current in the situation of a protection layer formed in the substrate, and to improve the pixel performance of the image sensor.

A method of fabricating a CIS is provided, which includes the following steps. First, an isolation structure is formed in a substrate with a photo-sensitive region and a transistor device region in the substrate. The transistor device region includes at least a region for forming a transfer transistor. Next, a first dielectric layer and a first conductive layer are sequentially formed on the substrate. Then, a first ion implantation process is performed to implant a first dopant into the substrate below a position for forming a gate of the transfer transistor and in the photo-sensitive region through the first conductive layer and the first dielectric layer. Afterwards, the first conductive layer and the first dielectric layer are patterned to form the gate structure of the transfer transistor on the transistor device region. Thereafter, a PD is formed in the substrate in the photo-sensitive region.

In the method of fabricating a CIS according to an embodiment of the present invention, the first dopant includes B or P.

In the method of fabricating a CIS according to an embodiment of the present invention, the first ion implantation process includes forming a patterned first mask layer on the first conductive layer to expose the first conductive layer above the position for forming the gate of the transfer transistor and the photo-sensitive region. Next, the first dopant is implanted into the substrate through the first conductive layer and the first dielectric layer by using the patterned first mask layer as a mask. Then, the patterned first mask layer is removed.

In the method of fabricating a CIS according to an embodiment of the present invention, after the step of sequentially forming the first dielectric layer and the first conductive layer on the substrate, and before performing the first ion implantation process, the method further includes sequentially forming a second dielectric layer and a second conductive layer on the first conductive layer, and then patterning the second conductive layer and the second dielectric layer. Wherein the step of patterning the first conductive layer and the first dielectric layer includes forming the gate structure of the transfer transistor and a composite structure constituted by the patterned first conductive layer, the patterned second dielectric layer, and the patterned second conductive layer simultaneously on the transistor device region.

In the method of fabricating a CIS according to an embodiment of the present invention, the transistor device region further includes a floating node doped region, and the first ion implantation process further includes implanting the first dopant into the substrate in the floating node doped region through the first conductive layer and the first dielectric layer.

In the method of fabricating a CIS according to an embodiment of the present invention, the first ion implantation process includes the following steps. A patterned second mask layer is formed on the first conductive layer to expose the first conductive layer above the floating node doped region, the position for forming the gate of the transfer transistor, and the photo-sensitive region. Next, the first dopant is implanted into the substrate through the first conductive layer and the first dielectric layer by using the patterned second mask layer as a mask. Then, the patterned second mask layer is removed.

In the method of fabricating a CIS according to an embodiment of the present invention, the method further includes performing a second ion implantation process. The second ion implantation process includes implanting a second dopant into the substrate on periphery of the isolation structure adjoining to the photo-sensitive region through the first conductive layer and the first dielectric layer.

In the method of fabricating a CIS according to an embodiment of the present invention, the second dopant includes B or P.

In the method of fabricating a CIS according to an embodiment of the present invention, the second ion implantation process includes the following steps. A patterned third mask layer is formed on the first conductive layer to expose the first conductive layer above the isolation structure adjoining to the photo-sensitive region and the periphery of the isolation structure. Next, the second dopant is implanted into the substrate on periphery of the isolation structure through the first conductive layer and the first dielectric layer by using the patterned third mask layer as a mask. Then, the patterned third mask layer is removed.

In the method of fabricating a CIS according to an embodiment of the present invention, the isolation structure includes a field oxide isolation structure or a shallow trench isolation structure.

The present invention further provides a CIS, which at least includes a substrate, an isolation structure, a PD, a transfer transistor, and a first protection layer. The isolation structure is disposed in the substrate with a photo-sensitive region and a transistor device region in the substrate. The PD is disposed in the photo-sensitive region. The transfer transistor is disposed on the transistor device region and adjoins to the PD. The first protection layer is disposed in the substrate below the gate of the transfer transistor and in the photo-sensitive region.

In the CIS according to an embodiment of the present invention, the dopant of the first protection layer includes B or P.

In the CIS according to an embodiment of the present invention, the CIS further includes a composite structure formed by sequentially stacking a first conductive layer, a first dielectric layer, and a second conductor. The composite structure is disposed on the transistor device region.

In the CIS according to an embodiment of the present invention, the transistor device region further includes a floating node doped region, and the CIS further includes a second protection layer disposed in the substrate in the floating node doped region.

In the CIS according to an embodiment of the present invention, the dopant of the second protection layer includes B or P.

In the CIS according to an embodiment of the present invention, the CIS further includes a third protection layer disposed in the substrate on periphery of the isolation structure adjoining to the photo-sensitive region.

In the CIS according to an embodiment of the present invention, the dopant of the third protection layer includes B or P.

In the CIS according to an embodiment of the present invention, the isolation structure includes a field oxide isolation structure or a shallow trench isolation structure.

In the present invention, before patterning the first conductive layer, an ion implantation process is performed through the first conductive layer to form a protection layer in the substrate in the photo-sensitive region and below the gate of the transfer transistor will be formed, or further to form a protection layer in the substrate in the floating node doped region or in the substrate on periphery of the isolation structure adjoining to the photo-sensitive region. Thus, the thermal process for the protection layer may be saved, thus avoiding the severe diffusion of the protection layer, alleviating the dark current, and improving the pixel performance of the image sensor.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

The First Embodiment

FIGS. 1A to 1E are schematic cross-sectional views of the processes of a method of fabricating a CIS according to a first embodiment of the present invention. Moreover, a CIS of 4-T architecture is taken as an example in this embodiment. In the figures, partial components are omitted and only the main parts are depicted.

Figure 1A:
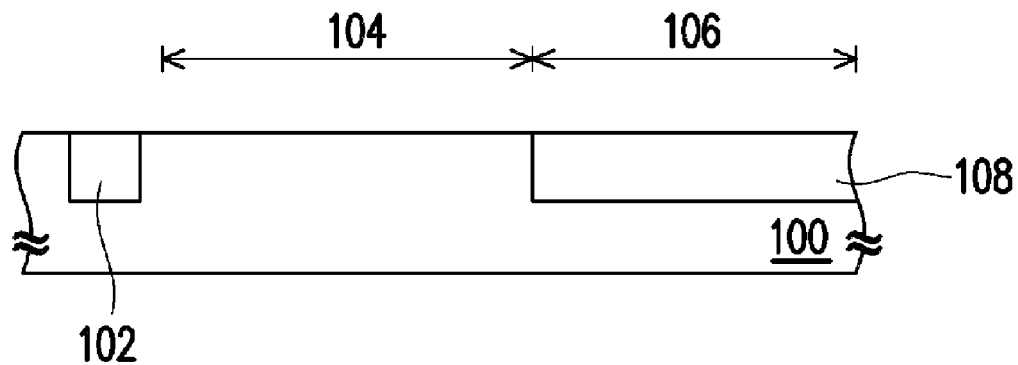
FIGS. 1A to 1E are schematic cross-sectional views of the processes of a method of fabricating a CIS according to a first embodiment of the present invention.

First, referring to FIG. 1A, a substrate 100 is provided. The substrate 100 is, for example, a silicon substrate or other semiconductor substrates. The conductive type of the substrate 100 is, for example, p-type. An isolation structure 102 is formed in the substrate 100 with a photo-sensitive region 104 and a transistor device region 106. The isolation structure 102 is, for example, a field oxide isolation structure or a shallow trench isolation structure. Moreover, at least a transfer transistor will be formed on the transistor device region 106 in subsequent processes.

Next, a p-well region 108 is formed in the substrate 100 in the transistor device region 106. The forming method of the p-well region 108 is described as follows. For example, a photoresist layer (not shown) is formed on the substrate 100 in the photo-sensitive region 104. Next, an ion implantation process is performed to implant B or other suitable p-type dopants into the substrate in the transistor device region 106. Then, the photoresist layer is removed. Definitely, in an embodiment, the p-well region may also be formed in the entire substrate 100.

Figure 1B:
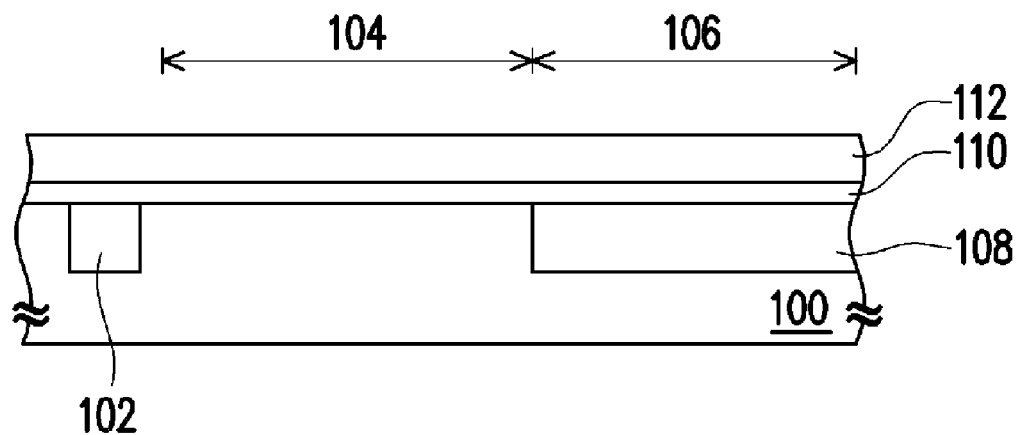

Then, referring to FIG. 1B, after the p-well region 108 is formed, a dielectric layer 110 is formed on the substrate 100, and the material thereof is, for example, silicon oxide. Afterwards, a conductive layer 112 is formed on the dielectric layer 110. The material of conductive layer 112 is, for example, polysilicon, and the forming method of the conductive layer 112 is, for example, chemical vapor deposition (CVD).

Figure 1C:
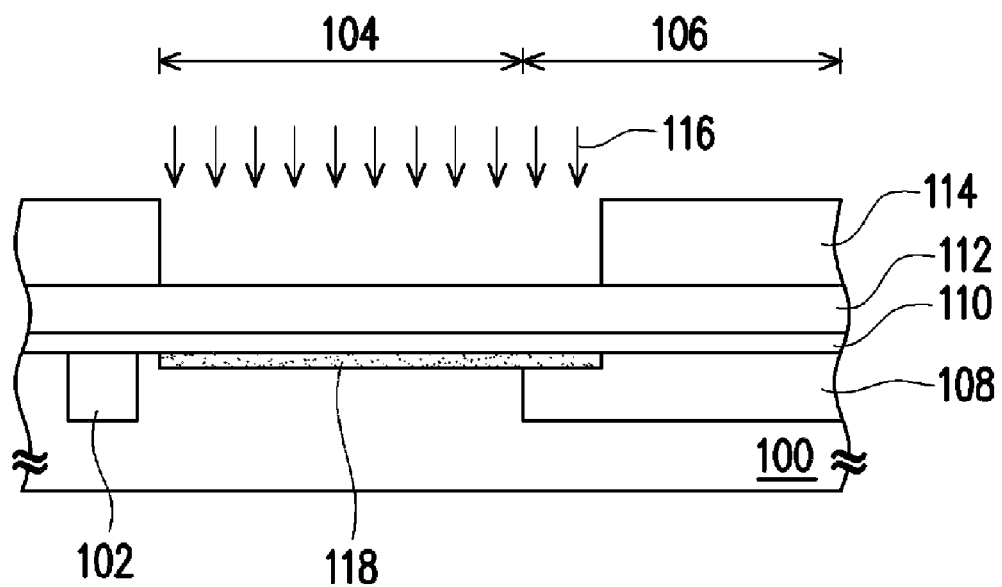

Thereafter, referring to FIG. 1C, a mask layer 114 is formed to expose the conductive layer 112 above the position for forming the gate of the transfer transistor and the photo-sensitive region 104. The mask layer 114 is, for example, a photoresist layer. Next, an ion implantation process 116 is performed by using the mask layer 114 as a mask to implant the p-type dopant into the substrate 100 exposed by the mask layer 114 through the conductive layer 112 and the dielectric layer 110 to form a protection layer 118. The p-type dopant is, for example, B or other suitable p-type dopants. After that, the mask layer 114 is removed.

Figure 1D:
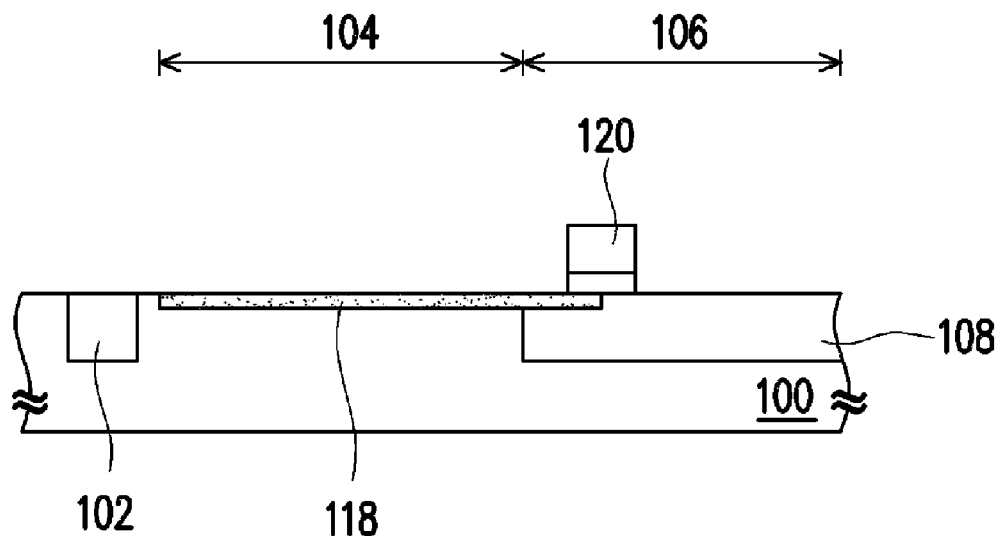

Next, referring to FIG. 1D, the dielectric layer 110 and the conductive layer 112 are patterned to at least form a gate structure 120 of the transfer transistor on the p-well region 108 of the transistor device region 106. Moreover, gate structures of other transistors may be formed in the transistor device region 106 not shown in FIG. 1D along with the process of patterning the dielectric layer 110 and the conductive layer 112. The method of patterning the dielectric layer 110 and the conductive layer 112 is, for example, lithography and etching.

Figure 1E:
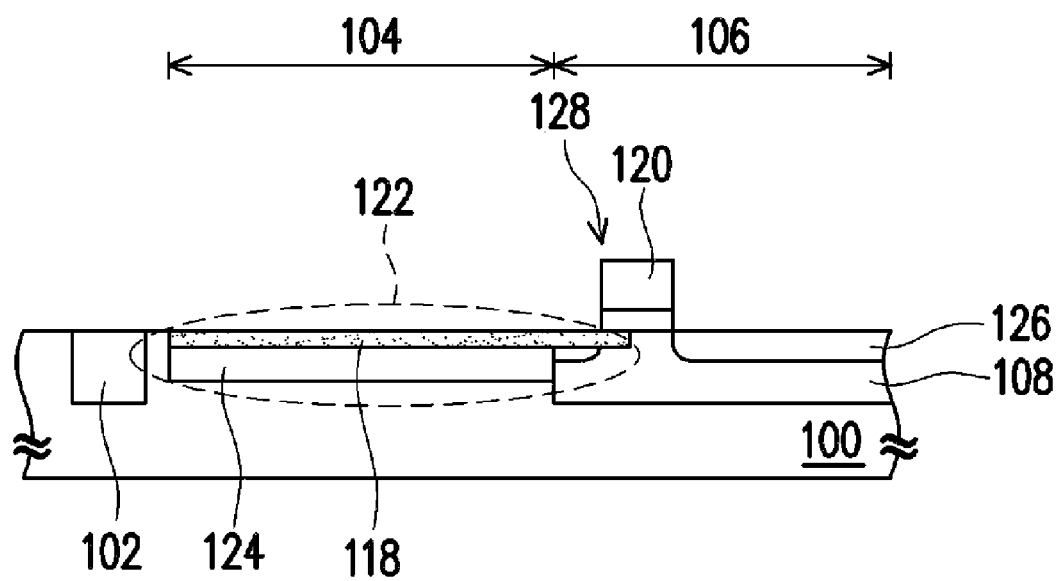

Afterwards, referring to FIG. 1E, a PD 122 is formed in the substrate 100 in the photo-sensitive region 104. The PD 122 is a p-n junction region, and is formed by, for example, a doping process. An n-type dopant is implanted into the p-type substrate 100 to form an n-doped region 124, and the n-doped region 124 and the p-type substrate 100 constitute the PD 122.

Then, after the PD 122 is formed, an n-type source/drain region 126 is further formed in the p-well region 108 to form a transfer transistor 128. The n-type source/drain region 126 of the transfer transistor 128 serves as a floating node doped region. The forming method of the n-type source/drain region 126 is, for example, ion implantation, for implanting P or other suitable n-type dopants into the p-well region 108.

Hereinafter, the CIS of the present invention will be illustrated below with reference to FIG. 1E.

Referring to FIG. 1E, the CIS of the present invention at least includes a substrate 100, an isolation structure 102, a protection layer 118, a PD 122, a floating node doped region 126, and a transfer transistor 128.

The isolation structure 102 is disposed in the substrate 100 with a photo-sensitive region 104 and a transistor device region 106 in the substrate 100. The PD 122 is disposed in the substrate 100 in the photo-sensitive region 104, for receiving a light source and converting the light energy into the electric energy. The PD 122 may be constituted by the p-type substrate 100 in the photo-sensitive region 104 and the n-doped region 124. The transfer transistor 128 is disposed on the transistor device region 106, and adjoins to the PD 122. The protection layer 118 is disposed in the substrate 100 below the gate of the transfer transistor 128 and in the photo-sensitive region 104, for providing protection to the disposed region and avoiding dark current. The floating node doped region 126 is disposed in the substrate 100 in the transistor device region 106, and is constituted by the n-type source/drain region of the transfer transistor 128. And, the material and forming method of all components of the CIS are the same as those in the above description, and the details will not be described herein again.

Figure 2:
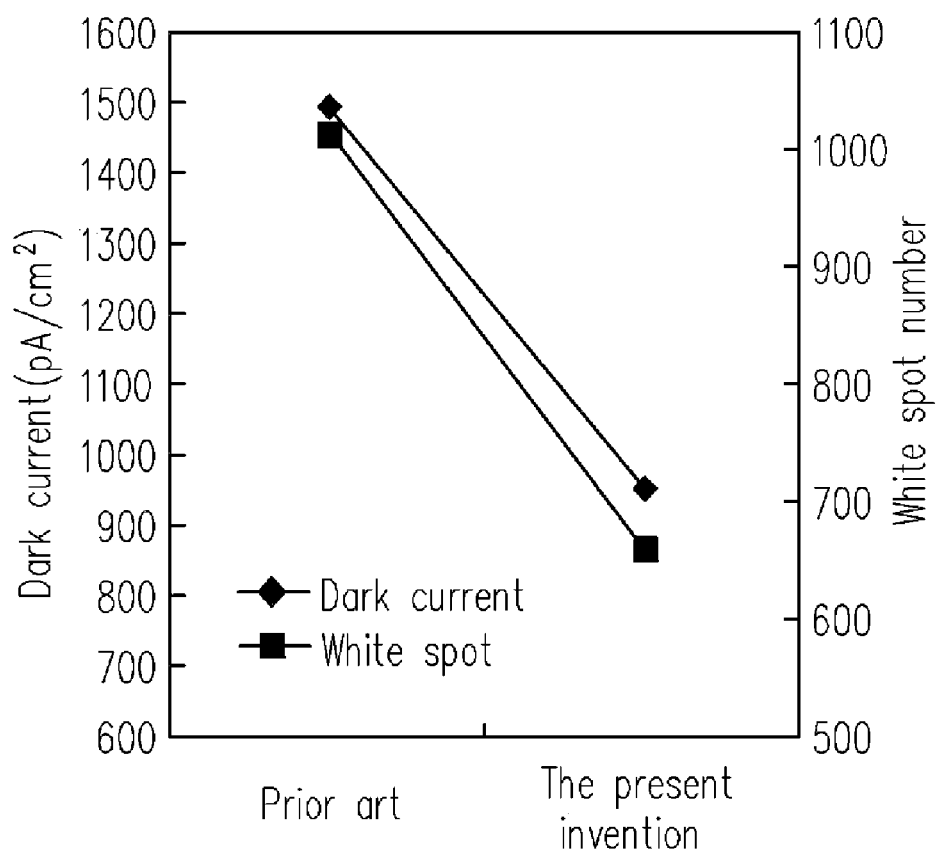
FIG. 2 is a schematic view showing the experiment results of testing the dark current and number of white spots of the devices fabricated according to the processes in the prior art and the present invention.

FIG. 2 is a schematic view showing the experiment results of testing the dark current and the number of white spots of devices fabricated according to the processes in the prior art and the present invention. From FIG. 2, it can be known that compared with the prior art in which ions are implanted into the substrate below the gate of the transfer transistor will be formed before forming the gate dielectric layer, ions are implanted into the substrate at the position for forming the gate of the transfer transistor and in the photo-sensitive region through the conductive layer before the conductive layer is patterned according to the present invention. The present invention not only significantly alleviates the dark current, but also reduces the number of the white spots, thus greatly improving the pixel performance of the image sensor.

The Second Embodiment

FIGS. 3A to 3E are schematic cross-sectional views of the processes of a method of fabricating a CIS according to a second embodiment of the present invention. Similarly, only the main parts required for illustration are depicted in this embodiment.

Figure 3A:
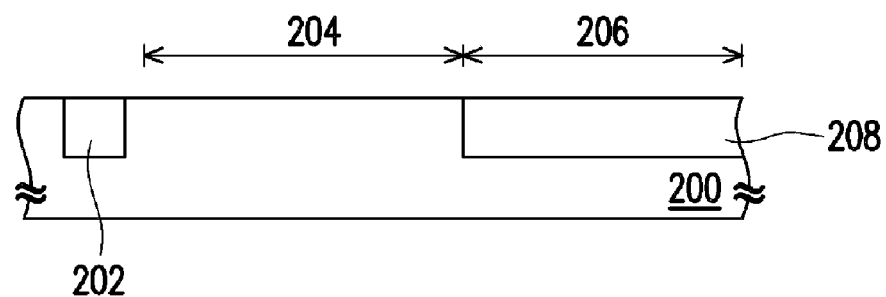
FIGS. 3A to 3E are schematic cross-sectional views of the processes of a method of fabricating a CIS according to a second embodiment of the present invention.

First, referring to FIG. 3A, a substrate 200 is provided. The substrate 200 is, for example, a silicon substrate or other semiconductor substrates, and the conductive type thereof is, for example, p-type. An isolation structure 202 is formed in the substrate 200 with a photo-sensitive region 204 and a transistor device region 206. The isolation structure 202 is, for example, a field oxide isolation structure or a shallow trench isolation structure. Moreover, at least a transfer transistor will be formed on the transistor device region 206 in subsequent processes.

Next, a p-well region 208 is formed in the substrate 200 in the transistor device region 206. The forming method of the p-well region 208 is described as follows. For example, a photoresist layer (not shown) is formed on the substrate 200 in the photo-sensitive region 204. Next, an ion implantation process is performed to implant B or other suitable p-type dopants into the substrate 200 in the transistor device region 206. Then, the photoresist layer is removed. Definitely, in an embodiment, a p-well region can also be formed in the entire substrate 200.

Figure 3B:
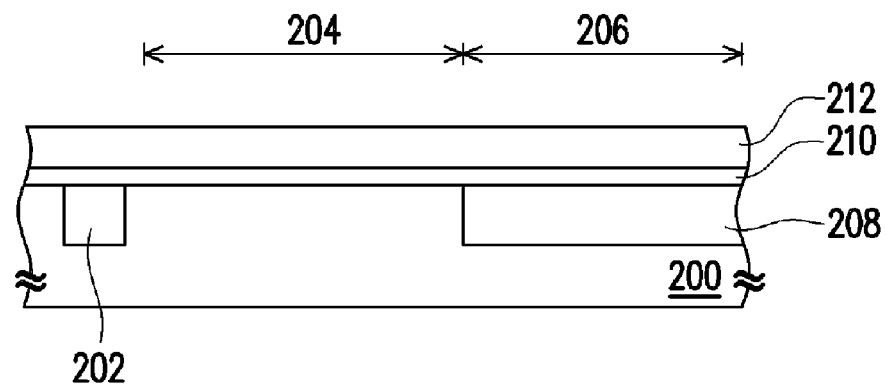

Then, referring to FIG. 3B, after the p-well region 208 is formed, a dielectric layer 210 is formed on the substrate 200, and the material thereof is, for example, silicon oxide. Afterwards, a conductive layer 212 is formed on the dielectric layer 210. The material of the conductive layer 212 is, for example, polysilicon, and the forming method of the conductive layer 212 is, for example, CVD.

Figure 3C:
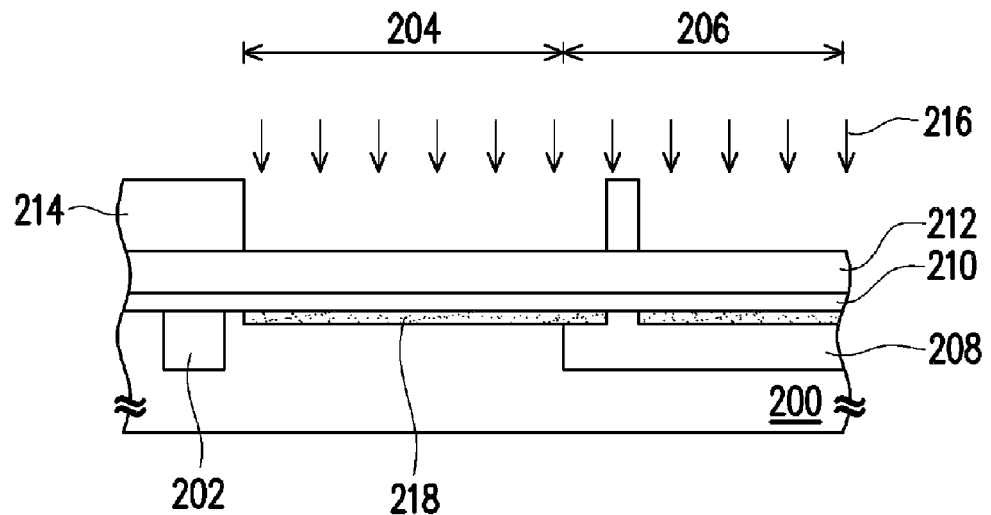

Thereafter, referring to FIG. 3C, a mask layer 214 is formed to expose the conductive layer 212 above the position for forming the floating node doped region and the photo-sensitive region 204 besides the position for forming the channel region of the transfer transistor. The mask layer 214 is, for example, a photoresist layer. Next, an ion implantation process 216 is performed by using the mask layer 214 as a mask to implant the p-type dopant into the substrate 200 exposed by the mask layer 214 through the conductive layer 212 and the dielectric layer 210 to form a protection layer 218. The p-type dopant is, for example, B or other suitable p-type dopants. After that, the mask layer 214 is removed.

Figure 3D:
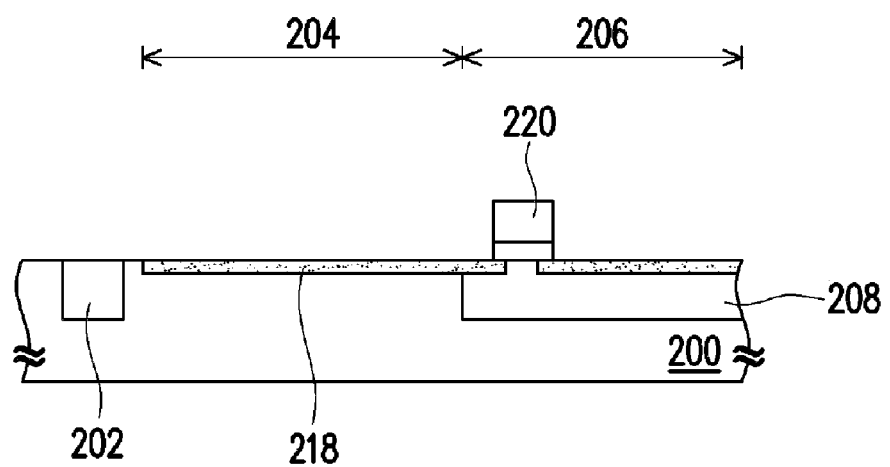

Next, referring to FIG. 3D, the dielectric layer 210 and the conductive layer 212 are patterned to at least form a gate structure 220 of the transfer transistor on the p-well region 208 of the transistor device region 206. Moreover, gate structures of other transistors can be formed in the transistor device region 206 not shown in FIG. 3D along with the process of patterning the dielectric layer 210 and the conductive layer 212. The method of patterning the dielectric layer 210 and the conductive layer 212 is, for example, lithography and etching.

Figure 3E:
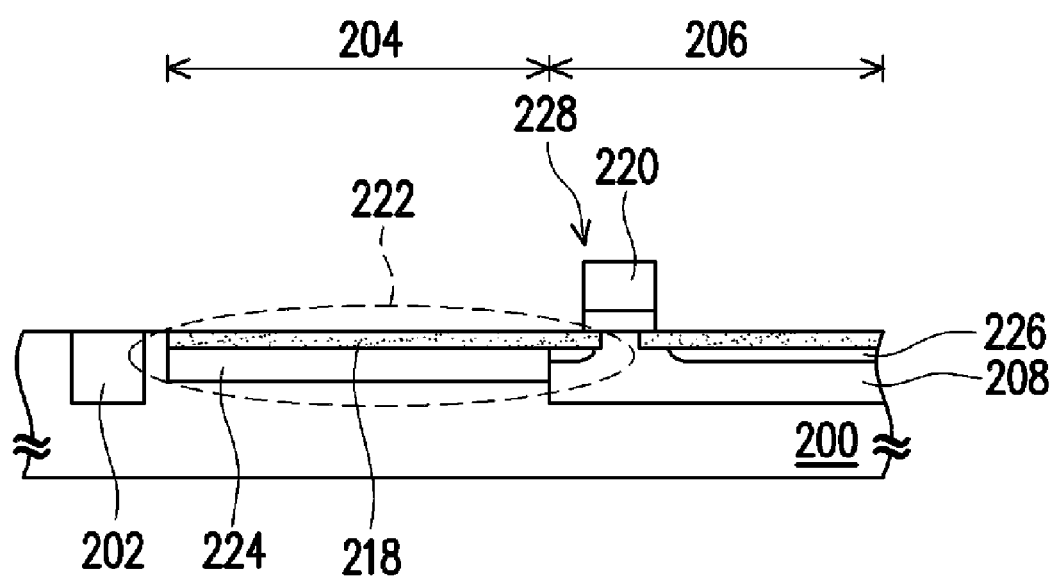

Afterwards, referring to FIG. 3E, a PD 222 is formed in the substrate 200 in the photo-sensitive region 204. The PD 222 is a p-n junction region, and is formed by, for example, doping. The n-type dopant is implanted into the p-type substrate 200 to form an n-doped region 224, and the n-doped region 224 and the p-type substrate 200 constitute the PD 222.

Then, after the PD 222 is formed, an n-type source/drain region 226 is further formed in the p-well region 208 to form a transfer transistor 228. The n-type source/drain region 226 of the transfer transistor 228 serves as the floating node doped region. The forming method of the n-type source/drain region 226 is, for example, ion implantation, for implanting P or other suitable n-type dopants into the p-well region 208.

Hereinafter, the CIS of the present invention will be illustrated below with reference to FIG. 3E.

Referring to FIG. 3E, the CIS of the present invention at least includes a substrate 200, an isolation structure 202, a protection layer 218, a PD 222, a floating node doped region 226, and a transfer transistor 228. In the structure of the CIS of this embodiment, except that the protection layer 218 may also be disposed in the substrate 200 in the floating node doped region 226, the arrangement positions of other components as the same as those in the first embodiment, so the details will not be described herein again. And, the material and forming method of all components of the CIS are the same as those in the above description, and the details will not be described herein again.

In this embodiment, a dopant is implanted into the substrate 200 both in the photo-sensitive region 204 and the floating node doped region 226 besides the position for forming the channel region of the transfer transistor through the conductive layer 212 during the same doping process 216 with a proper designed mask layer. Therefore, in addition to the substrate 200 in the photo-sensitive region 204 and below the transfer transistor 228, the substrate 200 in the floating node doped region 226 may also be protected.

The Third Embodiment

FIGS. 4A to 4F are schematic cross-sectional views of the processes of a method of fabricating a CIS according to a third embodiment of the present invention. Similarly, only the main parts required for illustration are depicted in this embodiment.

Figure 4A:
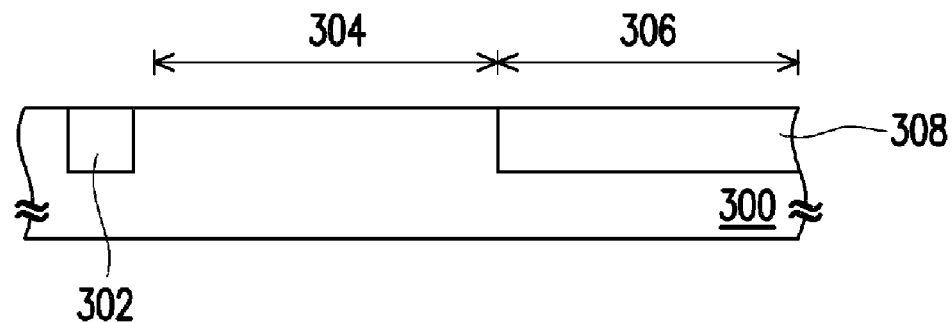
FIGS. 4A to 4F are schematic cross-sectional views of the processes of a method of fabricating a CIS according to a third embodiment of the present invention.

First, referring to FIG. 4A, a substrate 300 is provided. The substrate 300 is, for example, a silicon substrate or other semiconductor substrates, and the conductive type thereof is, for example, p-type. An isolation structure 302 is formed in the substrate 300 with a photo-sensitive region 304 and a transistor device region 306. The isolation structure 302 is, for example, a field oxide isolation structure or a shallow trench isolation structure. Moreover, at least a transfer transistor will be formed on the transistor device region 306 in subsequent processes.

Next, a p-well region 308 is formed in the substrate 300 in the transistor device region 306. The forming method of the p-well region 308 is described as follows. For example, a photoresist layer (not shown) is formed on the substrate 300 in the photo-sensitive region 304. Next, an ion implantation process is performed to implant B or other suitable p-type dopants into the substrate in the transistor device region 306. Then, the photoresist layer is removed. Definitely, in an embodiment, the p-well region may also be formed in the entire substrate 300.

Figure 4B:
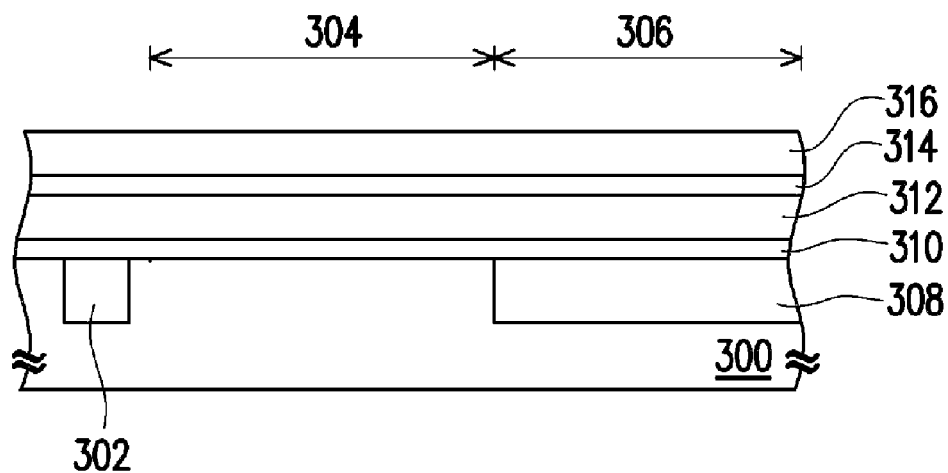

Then, referring to FIG. 4B, after the p-well region 308 is formed, a dielectric layer 310, a conductive layer 312, a dielectric layer 314, and a conductive layer 316 are sequentially formed on the substrate 300. The material of the dielectric layer 310 is, for example, silicon oxide, and the material of the conductive layers 312, 316 is, for example, polysilicon. The forming method of the above layers is, for example, CVD. The material of the dielectric layer 314 is, for example, the material suitable for serving as the dielectric layer between electrodes of a capacitor.

Figure 4C:
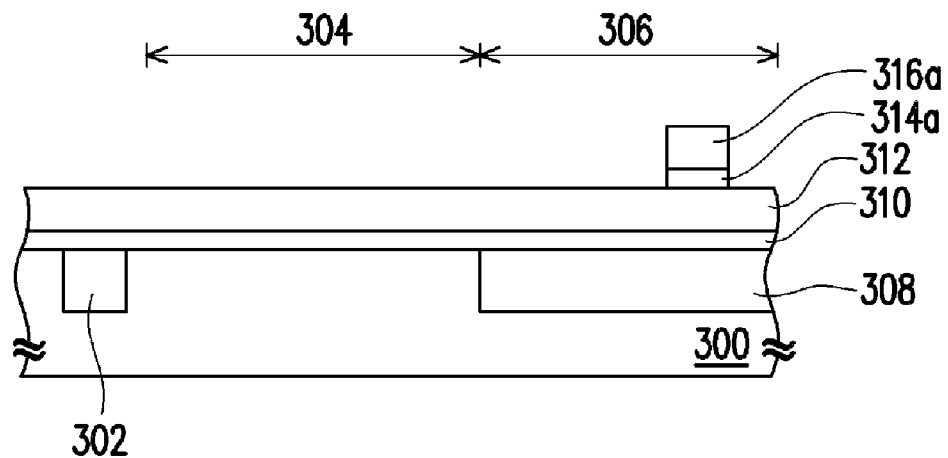

Next, referring to FIG. 4C, the conductive layer 316 and the dielectric layer 314 are patterned to form a patterned conductive layer 316a and a patterned dielectric layer 314a. The patterned conductive layer 316a and dielectric layer 314a, for example, respectively serve as an upper electrode and a dielectric layer of a capacitor. The method of patterning the dielectric layer 316 and the conductive layer 314 is, for example, lithography and etching.

Figure 4D:
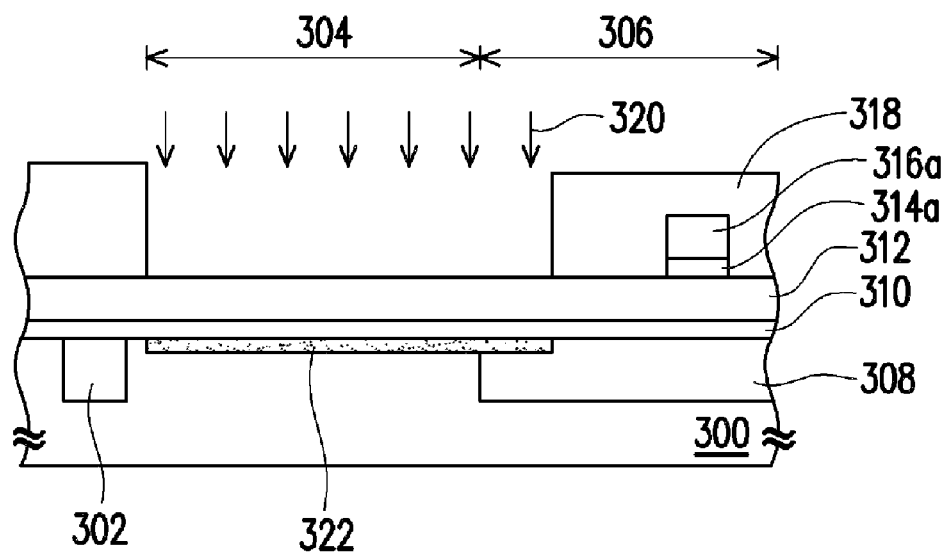

Thereafter, referring to FIG. 4D, a mask layer 318 is formed to expose the conductive layer 312 above the position for forming the gate of the transfer transistor and the photo-sensitive region 304. The mask layer 318 is, for example, a photoresist layer. Next, an ion implantation process 320 is performed by using the mask layer 318 as a mask to implant the p-type dopant into the substrate 300 exposed by the mask layer 318 through the conductive layer 312 and the dielectric layer 310 to form a protection layer 322. The p-type dopant is, for example, B or other suitable p-type dopants. After that, the mask layer 318 is removed.

Figure 4E:
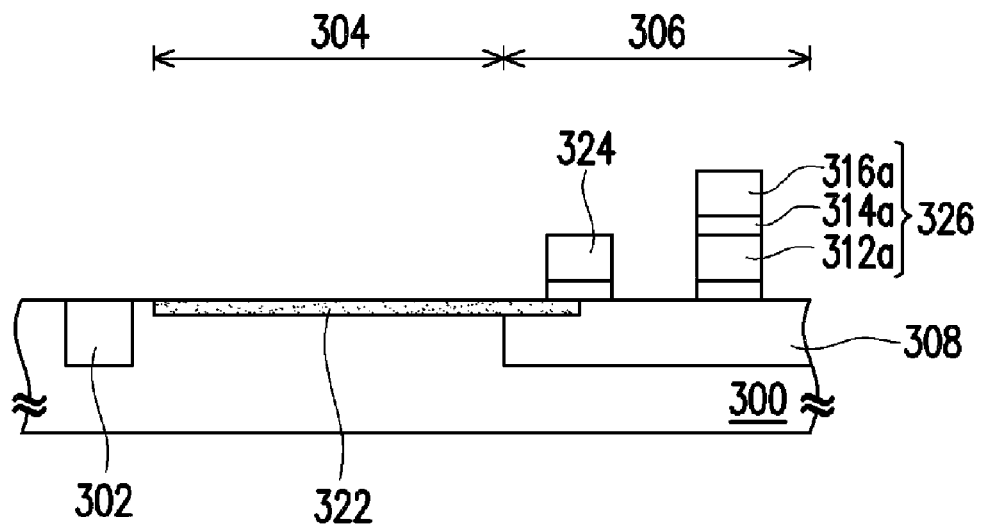

Next, referring to FIG. 4E, the dielectric layer 310 and the conductive layer 312 are patterned to at least form a gate structure 324 of the transfer transistor and a composite structure 326 constituted by the patterned conductive layer 316a, the patterned dielectric layer 314a, and the patterned conductive layer 312a on the p-well region 308 of the transistor device region 306. The composite structure 326, for example, may serve as a capacitor. Moreover, gate structures of other transistors may be formed in the transistor device region 306 not shown in FIG. 4E along with the process of patterning the dielectric layer 310 and the conductive layer 312. The method of patterning the dielectric layer 310 and the conductive layer 312 is, for example, lithography and etching.

Figure 4F:
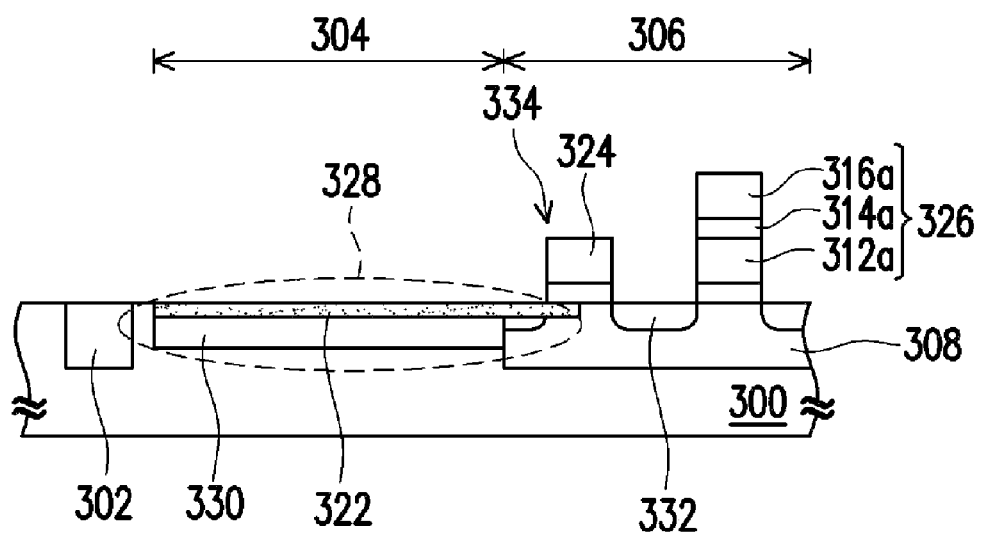

Afterwards, referring to FIG. 4F, a PD 328 is formed in the substrate 300 in the photo-sensitive region 304. The PD 328 is a p-n junction region, and is formed by, for example, doping. The n-type dopant is implanted into the p-type substrate 300 to form an n-doped region 330, and the n-doped region 330 and the p-type substrate 300 constitute the PD 328.

Then, after the PD 328 is formed, an n-type source/drain region 332 is further formed in the p-well region 308 to form a transfer transistor 334. The n-type source/drain region 332 of the transfer transistor 334 serves as the floating node doped region. The forming method of the n-type source/drain region 332 is, for example, ion implantation, for implanting P or other suitable n-type dopants into the p-well region 308.

Hereinafter, the CIS of the present invention will be illustrated below with reference to FIG. 4F.

Referring to FIG. 4F, the CIS of the present invention at least includes a substrate 300, an isolation structure 302, a protection layer 322, a PD 328, a floating node doped region 332, a composite structure 326, and a transfer transistor 334. In the structure of the CIS of this embodiment, except that the composite structure 326 of conductive layer/dielectric layer/conductive layer serving as a capacitor is disposed on the transistor device region 306, the arrangement positions of other components are the same as those in the first embodiment, so the details will not be described herein again. And, the material and forming method of all components of the CIS are the same as those in the above description, and the details will not be described herein again.

In this embodiment, the process of the CIS includes a step of forming the conductive layer/dielectric layer/conductive layer. If the protection layer 322 is formed by the prior art, the severe diffusion of the protection layer 322 may occur. However, through the process of this embodiment, the severe diffusion of the protection layer 322 may be avoided, thus avoiding influencing the device performance.

The Fourth Embodiment

FIGS. 5A to 5F are schematic cross-sectional views of the processes of a method of fabricating a CIS according to a fourth embodiment of the present invention. Similarly, only the main parts required for illustration are depicted in this embodiment.

Figure 5A:
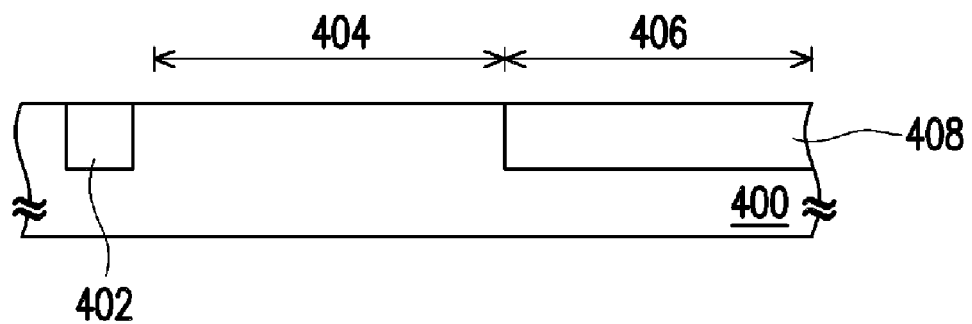
FIGS. 5A to 5F are schematic cross-sectional views of the processes of a method of fabricating a CIS according to a fourth embodiment of the present invention.

First, referring to FIG. 5A, a substrate 400 is provided. The substrate 400 is, for example, a silicon substrate or other semiconductor substrates, and the conductive type thereof is, for example, p-type. An isolation structure 402 is formed in the substrate 400 with a photo-sensitive region 404 and a transistor device region 406. The isolation structure 402 is, for example, a field oxide isolation structure or a shallow trench isolation structure. Moreover, at least a transfer transistor will be formed on the transistor device region 406 in subsequent processes.

Next, a p-well region 408 is formed in the substrate 400 in the transistor device region 406. The forming method of the p-well region 408 is described as follows. For example, a photoresist layer (not shown) is formed on the substrate 400 in the photo-sensitive region 404. Next, an ion implantation process is performed to implant B or other suitable p-type dopants into the substrate 400 in the transistor device region 406. Then, the photoresist layer is removed. Definitely, in an embodiment, the p-well region may also be formed in the entire substrate 400.

Figure 5B:
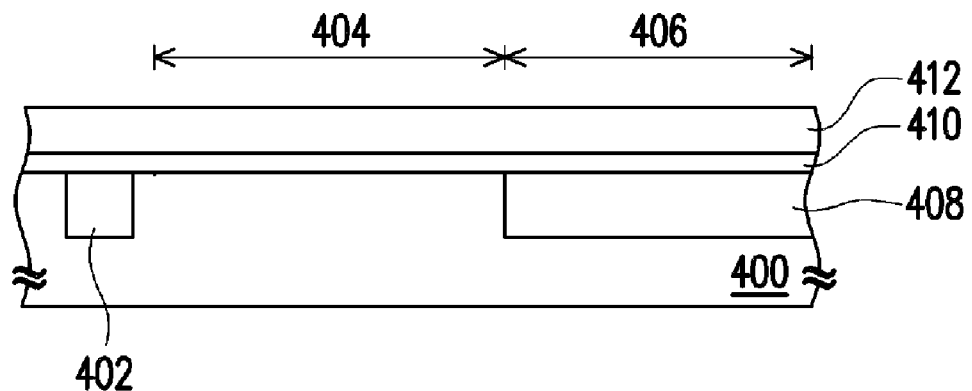

Then, referring to FIG. 5B, after the p-well region 408 is formed, a dielectric layer 410 is formed on the substrate 400, and the material thereof is, for example, silicon oxide. Afterwards, a conductive layer 412 is formed on the dielectric layer 410. The material of the conductive layer 412 is, for example, polysilicon, and the forming method of the conductive layer 412 is, for example, CVD.

Figure 5C:
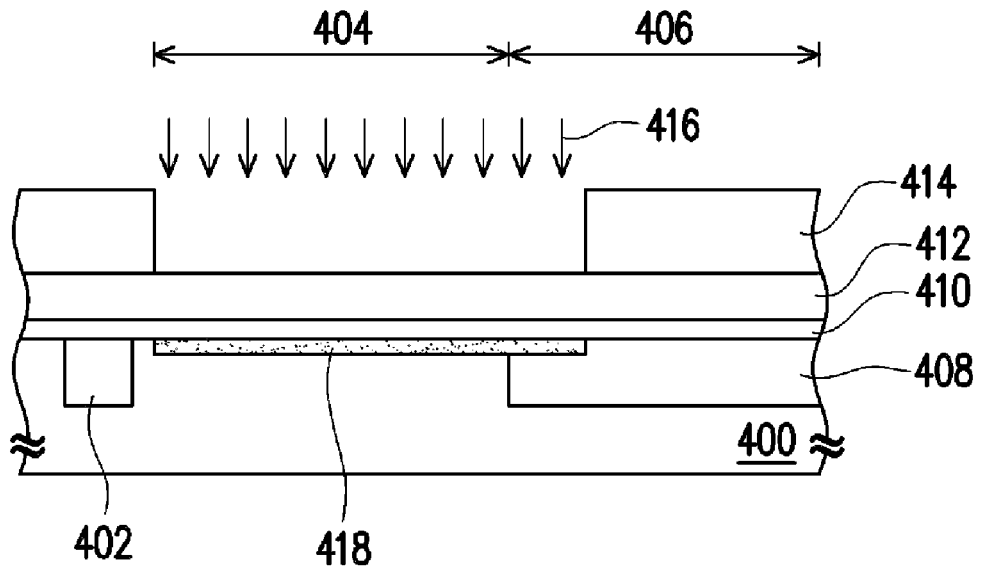

Thereafter, referring to FIG. 5C, a mask layer 414 is formed to expose the conductive layer 412 above the position for forming the gate of the transfer transistor and the photo-sensitive region 404. The mask layer 414 is, for example, a photoresist layer. Next, an ion implantation process 416 is performed by using the mask layer 414 as a mask to implant the p-type dopant into the substrate 400 exposed by the mask layer 414 through the conductive layer 412 and the dielectric layer 410 to form a protection layer 418. The p-type dopant is, for example, B or other suitable p-type dopants. After that, the mask layer 414 is removed.

Figure 5D:
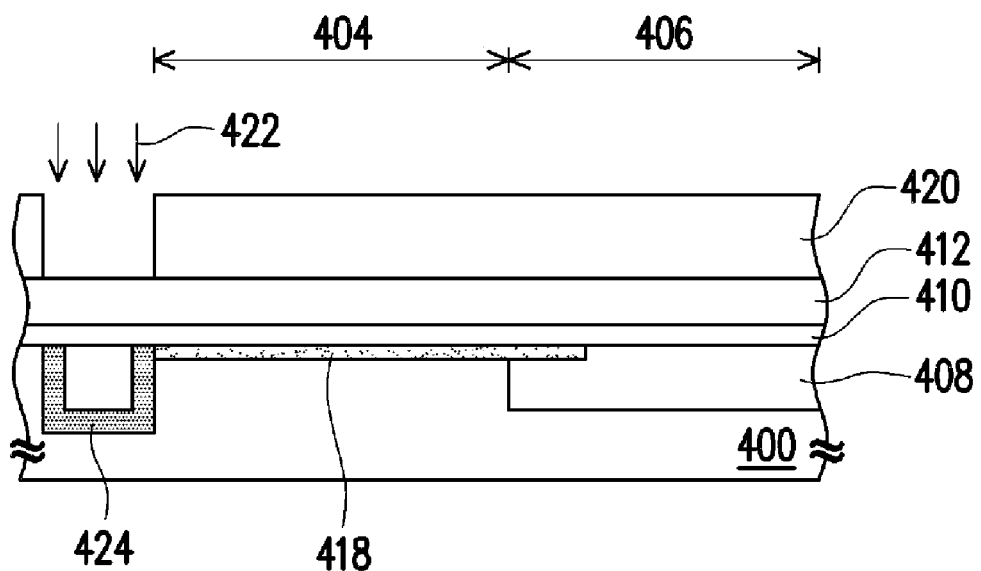

Then, referring to FIG. 5D, a mask layer 420 is formed to expose the conductive layer 412 above the isolation structure 402 and the periphery of the isolation structure 402. The mask layer 420 is, for example, a photoresist layer. Afterwards, an ion implantation process 422 is performed by using the mask layer 420 as a mask to implant the p-type dopant into the substrate 400 on periphery of the isolation structure 402 through the conductive layer 412 and the dielectric layer 410 to form a protection layer 424. The p-type dopant is, for example, B or other suitable p-type dopants. After that, the mask layer 420 is removed.

Figure 5E:
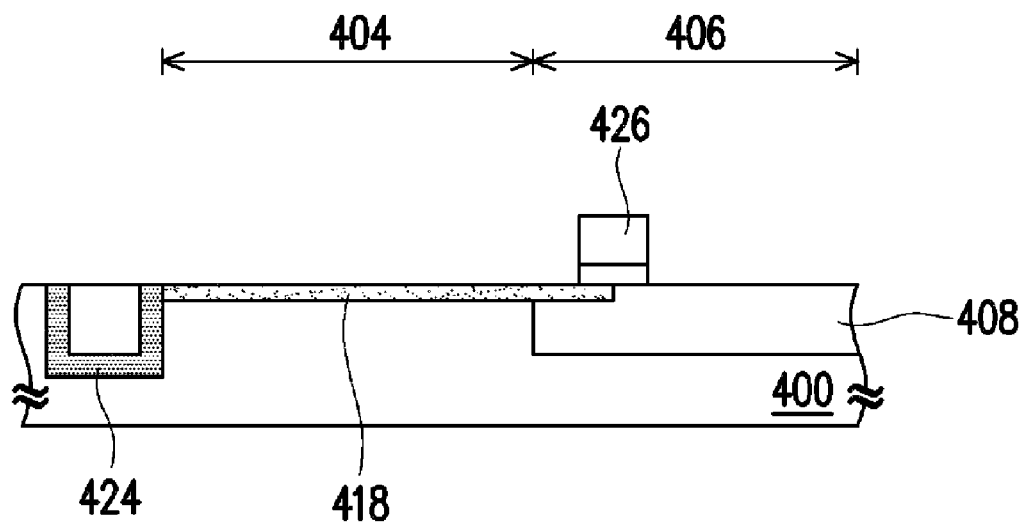

Next, referring to FIG. 5E, the dielectric layer 410 and the conductive layer 412 are patterned to at least form a gate structure 426 of the transfer transistor on the p-well region 408 of the transistor device region 406. Moreover, gate structures of other transistors can be formed in the transistor device region 406 not shown in FIG. 5E along with the process of patterning the dielectric layer 410 and the conductive layer 412. The method of patterning the dielectric layer 410 and the conductive layer 412 is, for example, lithography and etching.

Figure 5F:
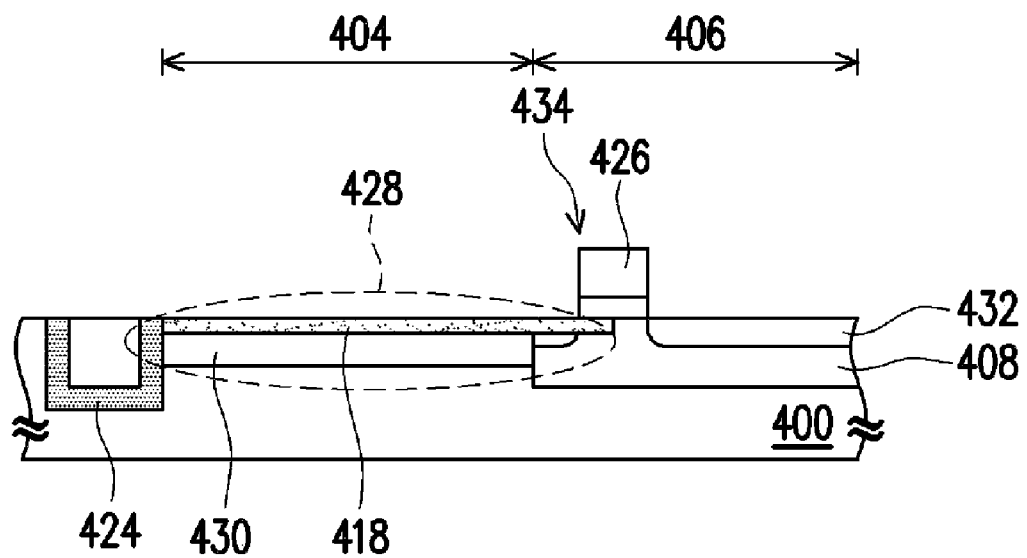

Afterwards, referring to FIG. 5F, a PD 428 is formed in the substrate 400 in the photo-sensitive region 404. The PD 428 is a p-n junction region, and is formed by, for example, doping. The n-type dopant is implanted into the p-type substrate 400 to form an n-doped region 430, and the n-doped region 430 and the p-type substrate 400 constitute the PD 428.

Then, after the PD 428 is formed, an n-type source/drain region 432 is further formed in the p-well region 408 to form a transfer transistor 434. The n-type source/drain region 432 of the transfer transistor 434 serves as a floating node doped region. The method of forming the n-type source/drain region 432 is, for example, ion implantation, for implanting P or other suitable n-type dopants into the p-well region 408.

Hereinafter, the CIS of the present invention will be illustrated below with reference to FIG. 5F.

Referring to FIG. 5F, the CIS of the present invention at least includes a substrate 400, an isolation structure 402, protection layers 418 and 424, a PD 428, a floating node doped region 432, and a transfer transistor 434. In the structure of the CIS of this embodiment, except that the protection layer 424 is further disposed in the substrate 400 on periphery of the isolation structure 402 adjoining to the photo-sensitive region 404, the arrangement positions of other members are the same as those in the first embodiment, so the details will not be described herein again.

If the protection layer on periphery of the isolation structure is formed according to the process of the prior art, in consideration of the diffusion of the protection layer caused by the thermal process, a high-dose protection layer must be formed to provide sufficient protection. However, the high-dose protection layer may further generate a lateral diffusion, such that the effective dosage of the n-type dopant in the PD region is reduced, leading to the decrease of the capacity of the well region. However, in this embodiment, as the protection layer 424 is also implanted into the substrate on periphery of the isolation structure 402 through the patterning conductive layer 412 before the conductive layer 412 is patterned, the protection layer 424 may be protected from generating the severe diffusion due to the thermal process. Compared with the prior art, the present invention not only alleviates the dark current, increases the capacity of the well region, but also eliminates the image delay, thereby enhancing the pixel performance of the image sensor.

In the above fourth embodiment, in consideration of different implantation depths, the protection layers 418, 424 are formed through different ion implantation processes 416, 422. However, without regard to the difference between the implantation depths of the protection layers 418, 424, in the process shown in FIG. 5C, the position for forming the protection layers 418, 424 may be exposed simultaneously by appropriately changing the pattern of the mask layer 414, and then the protection layers 418, 424 are formed through the ion implantation process 416 at the same time.

Moreover, the CIS in the above embodiments, for example, includes a p-type substrate, p-well region, an n-doped region, an n-type source/drain region, and a p-type protection layer adopting, for example, B for illustration. However, in practice, the present invention is not limited to the above, and the CIS may also include an n-type substrate, an n-well region, a p-doped region, a p-type source/drain region, and an n-type protection layer adopting, for example, P, or may be implemented by other conventional method.

In view of the above, according to the present invention, before the conductive layer is patterned to form the gate structure, a doping process is performed through the conductive layer to form a protection layer in the substrate in the photo-sensitive region and below the gate of the transfer transistor will be formed, or to further form a protection layer in the substrate in the floating node doped region or in the substrate on periphery of the isolation structure adjoining to the photo-sensitive region. Thus, the thermal process for the protection layer is omitted, so the severe diffusion of the protection layer is prevented, thus alleviating the dark current and improving the pixel performance of the image sensor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a complementary metal-oxide-semiconductor image sensor (CIS), comprising:
    forming an isolation structure in a substrate with a photo-sensitive region and a transistor device region in the substrate, wherein the transistor device region comprises at least a region for forming a transfer transistor later;
    forming a first dielectric layer and a first conductive layer on the substrate;
    performing a first ion implantation process to implant a first dopant into the substrate below a position for forming a gate of the transfer transistor and in the photo-sensitive region through the first conductive layer and the first dielectric layer;
    after performing the first ion implantation process, patterning the first conductive layer and the first dielectric layer to form the gate structure of the transfer transistor on the transistor device region; and
    forming a photo diode (PD) in the substrate in the photo-sensitive region.

2. The method of fabricating a CIS as claimed in claim 1, wherein the first dopant comprises B or P.

3. The method of fabricating a CIS as claimed in claim 1, wherein the first ion implantation process comprises:
    forming a patterned first mask layer on the first conductive layer to expose the first conductive layer above the position for forming the gate of the transfer transistor and the photo-sensitive region;
    implanting the first dopant into the substrate through the first conductive layer and the first dielectric layer by using the patterned first mask layer as a mask; and
    removing the patterned first mask layer.

4. The method of fabricating a CIS as claimed in claim 1, after the step of sequentially forming the first dielectric layer and the first conductive layer on the substrate, and before performing the first ion implantation process, further comprising:
    sequentially forming a second dielectric layer and a second conductive layer on the first conductive layer; and
    patterning the second conductive layer and the second dielectric layer, wherein, the step of patterning the first conductive layer and the first dielectric layer comprises forming the gate structure of the transfer transistor and a composite structure constituted by the patterned first conductive layer, the patterned second dielectric layer, and the patterned second conductive layer simultaneously on the transistor device region.

5. The method of fabricating a CIS as claimed in claim 1, wherein the transistor device region further comprises a floating node doped region, and the first ion implantation process further comprises implanting the first dopant into the substrate in the floating node doped region through the first conductive layer and the first dielectric layer.

6. The method of fabricating a CIS as claimed in claim 5, wherein the first ion implantation process comprises:
    forming a patterned second mask layer on the first conductive layer to expose the first conductive layer above the floating node doped region, the position for forming the gate of the transfer transistor, and the photo-sensitive region;
    implanting the first dopant into the substrate through the first conductive layer and the first dielectric layer by using the patterned second mask layer as a mask; and
    removing the patterned second mask layer.

7. The method of fabricating a CIS as claimed in claim 1, further comprising performing a second ion implantation process, wherein the second ion implantation process comprises implanting a second dopant into the substrate on periphery of the isolation structure adjoining to the photo-sensitive region through the first conductive layer and the first dielectric layer.

8. The method of fabricating a CIS as claimed in claim 7, wherein the second dopant comprises B or P.

9. The method of fabricating a CIS as claimed in claim 7, wherein the second ion implantation process comprises:
    forming a patterned third mask layer on the first conductive layer to expose the first conductive layer above the isolation structure adjoining to the photo-sensitive region and the periphery of the isolation structure;
    implanting the second dopant into the substrate on periphery of the isolation structure through the first conductive layer and the first dielectric layer by using the patterned third mask layer as a mask; and
    removing the patterned third mask layer.

10. The method of fabricating a CIS as claimed in claim 1, wherein the isolation structure comprises a field oxide isolation structure or a shallow trench isolation structure.

11. The method of fabricating a CIS as claimed in claim 1, wherein a well region is formed in the substrate before the first dielectric layer and the first conductive layer are formed on the substrate.

12. A method of fabricating a complementary metal-oxide-semiconductor image sensor (CIS), comprising:
    forming an isolation structure in a substrate with a photo-sensitive region and a transistor device region in the substrate, wherein the transistor device region comprises at least a region for forming a transfer transistor later;
    forming a well-region in the substrate at the transistor device region;
    after forming the well region, forming a first dielectric layer and a first conductive layer on the substrate;
    performing a first ion implantation process to implant a first dopant into the substrate below a position for forming a gate of the transfer transistor and in the photo-sensitive region through the first conductive layer and the first dielectric layer;
    patterning the first conductive layer and the first dielectric layer to form the gate structure of the transfer transistor on the transistor device region; and
    forming a photo diode (PD) in the substrate in the photo-sensitive region.

13. The method of fabricating a CIS as claimed in claim 12, wherein the first conductive layer and the first dielectric layer are patterned to form the gate structure after performing the first ion implantation process.

14. The method of fabricating a CIS as claimed in claim 12, wherein the first ion implantation process comprises:

forming a patterned first mask layer on the first conductive layer to expose the first conductive layer above the position for forming the gate of the transfer transistor and the photo-sensitive region;

implanting the first dopant into the substrate through the first conductive layer and the first dielectric layer by using the patterned first mask layer as a mask; and removing the patterned first mask layer.

15. The method of fabricating a CIS as claimed in claim 12, after the step of sequentially forming the first dielectric layer and the first conductive layer on the substrate, and before performing the first ion implantation process, further comprising:

sequentially forming a second dielectric layer and a second conductive layer on the first conductive layer; and patterning the second conductive layer and the second dielectric layer, wherein, the step of patterning the first conductive layer and the first dielectric layer comprises forming the gate structure of the transfer transistor and a composite structure constituted by the patterned first conductive layer, the patterned second dielectric layer, and the patterned second conductive layer simultaneously on the transistor device region.

16. The method of fabricating a CIS as claimed in claim 12, wherein the transistor device region further comprises a floating node doped region, and the first ion implantation process further comprises implanting the first dopant into the substrate in the floating node doped region through the first conductive layer and the first dielectric layer.

17. The method of fabricating a CIS as claimed in claim 16, wherein the first ion implantation process comprises:

forming a patterned second mask layer on the first conductive layer to expose the first conductive layer above the floating node doped region, the position for forming the gate of the transfer transistor, and the photo-sensitive region;

implanting the first dopant into the substrate through the first conductive layer and the first dielectric layer by using the patterned second mask layer as a mask; and removing the patterned second mask layer.

18. The method of fabricating a CIS as claimed in claim 12, further comprising performing a second ion implantation process, wherein the second ion implantation process comprises implanting a second dopant into the substrate on periphery of the isolation structure adjoining to the photo-sensitive region through the first conductive layer and the first dielectric layer.

19. The method of fabricating a CIS as claimed in claim 18, wherein the second ion implantation process comprises:

forming a patterned third mask layer on the first conductive layer to expose the first conductive layer above the isolation structure adjoining to the photo-sensitive region and the periphery of the isolation structure;

implanting the second dopant into the substrate on periphery of the isolation structure through the first conductive layer and the first dielectric layer by using the patterned third mask layer as a mask; and removing the patterned third mask layer.

* * * * *